(12) United States Patent
Matsuoka

(10) Patent No.: US 7,527,497 B2
(45) Date of Patent: May 5, 2009

(54) HEAT TREATING APPARATUS, HEAT TREATING METHOD, AND STORAGE MEDIUM

(75) Inventor: Nobuaki Matsuoka, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 261 days.

(21) Appl. No.: 11/685,383

(22) Filed: Mar. 13, 2007

(65) Prior Publication Data

US 2007/0218706 A1 Sep. 20, 2007

(30) Foreign Application Priority Data

Mar. 14, 2006 (JP) ............................. 2006-069810

(51) Int. Cl.
*F27D 7/04* (2006.01)
*H01L 31/024* (2006.01)
(52) U.S. Cl. ...................... 432/5; 392/416; 438/660; 438/715; 118/725
(58) Field of Classification Search ................ 219/209, 219/390; 392/416; 438/660, 663, 715; 118/724, 118/725, 50.1
See application file for complete search history.

(56) References Cited

U.S. PATENT DOCUMENTS 3,946,429 A * 3/1976 Kessler, Jr. .................. 257/665

6,729,261 B2 * 5/2004 Hongo ............... 118/723 MW
2001/0038988 A1 * 11/2001 Oda et al. ..................... 432/5
2005/0070434 A1 * 3/2005 Drake ......................... 503/227
2006/0234178 A1 * 10/2006 Hayashi et al. ............. 432/198

FOREIGN PATENT DOCUMENTS

JP 2001-230172 8/2001

* cited by examiner

*Primary Examiner*—Kenneth Bomberg
*Assistant Examiner*—Robert E Thomas
(74) *Attorney, Agent, or Firm*—Oblon, Spivak, McClelland, Maier & Neustadt, P.C.

(57) ABSTRACT

A heat treating apparatus includes a heating plate for heating a substrate coated with a coating liquid, a cooling plate for cooling the substrate and a heat pipe provided in the cooling plate, a cooling chamber being moved together with the cooling plate by the drive mechanism and accommodating a cooling liquid for cooling one end side of the heat pipe. The apparatus further includes a circulation passage provided in the heat treating apparatus to circulate the cooling liquid in the cooling chamber, a circulation pump for circulating the cooling liquid in the circulation passage; and a heat radiating member provided on the circulation passage to radiate the heat received by the cooling chamber to the outside of the heat treating apparatus.

9 Claims, 13 Drawing Sheets

HEAT TREATING APPARATUS, HEAT TREATING METHOD, AND STORAGE MEDIUM

FIELD OF THE INVENTION

The present invention relates to a heat treating apparatus including a heating plate heating a substrate, e.g., a semiconductor wafer, coated with a coating liquid, such as, and a cooling plate conveying the heated substrate, and a heat treating method.

BACKGROUND OF THE INVENTION

A coating and developing apparatus for coating a resist to a substrate and developing the substrate after exposure is used as an apparatus for forming a resist pattern on a substrate such as a semiconductor wafer or a glass substrate for a liquid crystal display (LCD). A heat treating apparatus called bake apparatus is employed in the coating and developing apparatus. For example, an apparatus for heating a substrate coated with a liquid resist takes a role in drying a solvent in the liquid resist.

An example of such a heat treating apparatus 100 is shown in FIG. 13. The heat treating apparatus 100 is divided into an upper chamber 102 and a lower chamber 103 which are partitioned by a bottom plate 101. A cooling plate 104 and a heat treating section 105 are installed in the upper chamber 102 and lifting mechanisms 106 and 107 of wafers are installed in the lower chamber 103. The cooling plate 104 can be moved by a drive mechanism (not shown) between a position (home position) shown in the Figure and an upper position of a heating plate 108 provided in the heat treating section 105. That is, if a substrate, e.g. a wafer, which is transferred from a transfer port 109 into the upper chamber 102 by a transfer mechanism (not shown), is mounted on the cooling plate disposed in the home position by the lifting mechanism 106, it is moved to the upside of the heating plate 108 by the cooling plate 104 and is mounted on the heating plate 108 via the lifting mechanism 107.

Then, after the cooling plate 104 is returned to the home position, the wafer is heat-treated on the heating plate 108. Further, during the heat treatment, supply of a gas and exhaustion of a volatile material are performed with respect to the wafer by a gas supply unit 113 and an exhaustion unit 114 via a gas supply pipe 111 and an exhaustion pipe 112 which are connected to an upper cover 110. Further, the cooling plate 104 is moved to the upside of the heating plate 108 and the wafer is received from the heating plate 108 to the cooling plate 104 via the lifting mechanism 107. Then, the wafer is returned to the home position and a rough cooling is performed to the wafer.

In the case in which the heat treating apparatus 100 is embedded in the coating and developing apparatus, the wafer is conveyed from the upper chamber 102 to a cooling plate for precise control of temperature by a conveyer mechanism (not shown) so that the temperature of the wafer can be precisely controlled. As mentioned above, since the time required for performing cooling in the cooling plate for precise control of temperature is shortened by performing cooling with the cooling plate 104 provided in the heat treating apparatus 100, the number of cooling plates for precise control of temperature, which are required for the coating and developing apparatus, can be reduced, thereby scaling down the coating and developing apparatus.

On the other hand, in the conventional heat treating apparatus, the wafer mounted onto the cooling plate is cooled by flowing a cooling liquid in a cooling pipe provided in the interior of or at a lower portion of the cooling plate, which complicates the structure of the cooling plate and increase the size of the heat treating apparatus.

In order to solve the problem and to simplify the overall structure of a heat treating apparatus, for example, Japanese Patent Laid-open application No. 2001-230172 discloses a technology in which heat pipes are provided in the a cooling plate instead of a cooling pipe to cooling the cooling plate through the heat pipes. A plurality of lines of heat pipes are installed in the interior of the cooling plate. The heat pipes absorbs the heat of a wafer mounted onto the cooling plate and discharges the heat to a cooling medium such as a cooling water flowing in a heat exchanging unit installed adjacent to the cooling plate. The cooling medium is supplied from a cooling medium source to the heat exchanging unit via a supply pipe. Then, the heat is absorbed from the heat pipes by the heat exchanging unit and is discharged to a discharge passage via a discharge pipe.

In the case of maintaining or exchanging the cooling plate or the heat treating apparatus set, since there is a need to separate a heat treating apparatus from the coating and developing apparatus, it is necessary to separate a supply pipe and a discharge pipe from the cooling plate. Then, since a cooling medium remains in the heat exchanging unit, the cooling medium drops when the supply pipe and the discharge pipe are separated from the cooling plate, thereby causing troubles in an electrical system of the coating and developing apparatus and producing particles on a wafer. Therefore, in the case in which the supply pipe and the discharge pipe are separated from the cooling plate, a gas is supplied into the pipe to discharge the cooling medium in the pipe, which is time-consuming.

SUMMARY OF THE INVENTION

It is, therefore, an object of the present invention to provide a technology capable of easily maintaining and exchanging a heat treating apparatus including a cooling plate in which a heat pipe is installed and a technology capable of scaling down and simplifying the heat treating apparatus.

In accordance with a first aspect of the present invention, there is provided a heat treating apparatus including: a heating plate for heating a substrate coated with a coating liquid; a cooling plate for cooling the substrate, the cooling plate being moved by a drive mechanism between a home position for transferring the substrate between the cooling plate and an external conveyer mechanism and an upper position above the heating plate for transferring the substrate between the cooling plate and the heating plate; a heat pipe provided in the cooling plate; a cooling chamber being moved together with the cooling plate by the drive mechanism and accommodating a cooling liquid for cooling one end side of the heat pipe; a circulation passage provided in the heat treating apparatus to circulate the cooling liquid in the cooling chamber; a circulation pump for circulating the cooling liquid in the circulation passage; and a heat radiating member provided in the circulation passage to radiate the heat received by the cooling chamber to the outside of the heat treating apparatus.

It is preferable that the heat treating apparatus further includes a heat conducting heat pipe, one end of which is submerged in the cooling chamber and the other end of which is disposed in the vicinity of one end of the heat pipe to receive the heat thereof.

It is also preferable that the heat treating apparatus further includes an exhaustion fan unit serving as a part of the heat treating radiation member, the heat radiating member has a heat radiating fin unit, and the exhaustion fan exhausts an upper side atmosphere of the heating plate to the outside of the heat treating apparatus and blows an discharge flow from the exhaustion fan to the heat radiating fin unit.

It is preferable that the drive mechanism also drives the circulation pump and the cooling liquid is circulated when moving the cooling plate.

In accordance with a second aspect of the present invention, there is provided a heat treating method for heat-treating a substrate by a heat treating apparatus provided with a heating plate for heating the substrate coated with a coating liquid and a cooling plate for cooling the substrate, the method including the steps of: heating the substrate with the heating plate; moving the cooling plate between the heating plate and the substrate and mounting the heated substrate onto the cooling plate; retreating the cooling plate to a region adjacent to the heating plate by a drive mechanism; transferring the substrate disposed on the cooling plate to an external conveyer mechanism; radiating the heat of the cooling plate via a heat pipe provided in the cooling plate to a cooling chamber which moves together with the cooling plate and accommodates a cooling liquid therein; circulating the cooling liquid in the cooling chamber by a circulation pump in a circulation passage provided in the heat treating apparatus; and radiating the heat conducted to the cooling liquid in the cooling chamber to the outside of the heat treating apparatus by a heat radiating member provided on the circulation passage.

It is preferable that the step of radiating the heat of the cooling plate to the cooling chamber via the heat pipe includes the step of heat-conducting through a heat conducting heat pipe, one end of which is submerged in the cooling chamber and the other end of which is disposed in the vicinity of one end of a heat pipe to receive the heat of the heat pipe.

It is preferable that the method further includes the steps of exhausting an upper side atmosphere of the heating plate to the outside of the heat treating apparatus by an exhaustion fan and blowing a discharge flow from the exhaustion fan to a heat radiating fin unit provided in the heat radiating means.

It is also preferable that the step of circulating the cooling liquid by the circulation pump is performed by driving the circulation pump with the drive mechanism when moving the cooling plate.

In accordance with a third aspect of the present invention, there is provided a storage medium storing a computer executable program for use in a heat treating apparatus for heating and cooling a substrate coated with a coating liquid, wherein the computer executable program is configured to perform the heat treating method.

An embodiment of the present invention includes, in the interior of the heat treating apparatus, a cooling chamber for cooling a heat pipe, a circulation passage of a cooling liquid which is provided with a heat radiating means for cooling the cooling liquid, and a circulation pump for circulating the cooling liquid in the cooling chamber via the circulation passage, in order to cool a cooling plate in which a heat pipe is installed with the cooling liquid. Since the embodiment excludes a cooling liquid pipe from outside of the heat treating apparatus, when the heat treating apparatus is mounted or detached to and from the installation place of the coating and developing apparatus, the cooling liquid pipe does not need to be mounted or separated.

Further, when the heat treating apparatus is separated from the installation place, since a trouble of leaking the cooling liquid is not generated, the heat treating apparatus can be easily maintained or exchanged.

Further, due to a structure in which a heat radiating fin unit is provided in the circulation passage of the cooling liquid as a heat radiating means of the cooling liquid and an exhausted atmosphere in the interior of the heat treating apparatus by an exhaustion fan is injected to the heat radiating fin unit, a blowing unit for the heat radiating fin unit does not need to be separately installed, thereby reducing the number of parts and scaling down and simplifying the heat treating apparatus.

BRIEF DESCRIPTION OF THE DRAWINGS

The above and other objects and features of the present invention will become apparent from the following description of preferred embodiments, given in conjunction with the accompanying drawings, in which.

DETAILED DESCRIPTION OF THE PREFERRED EMBODIMENT

Figure 1:
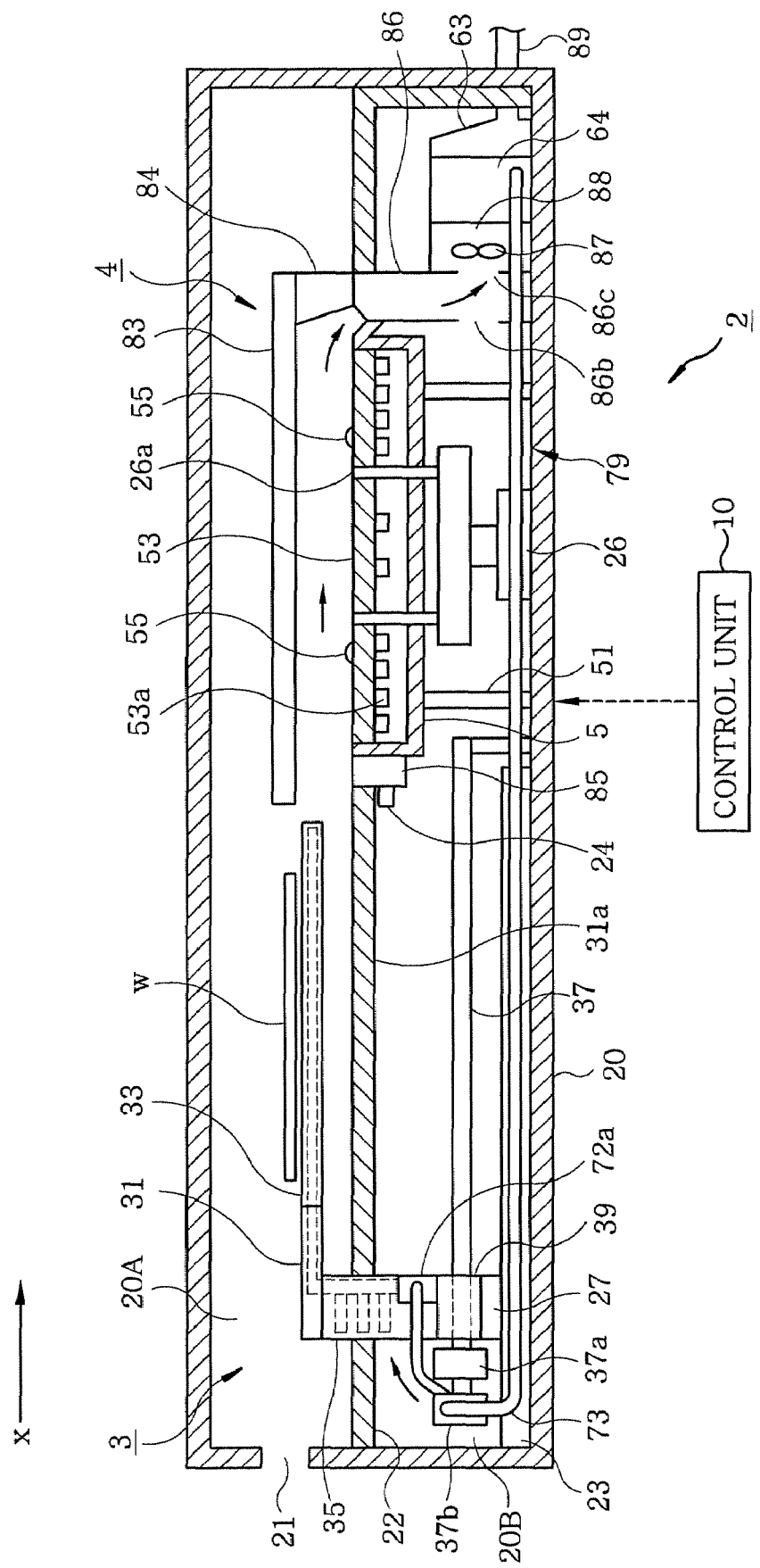
FIG. 1 is a longitudinal side sectional view showing an example of a heat treating apparatus according to the present invention.
Figure 2:
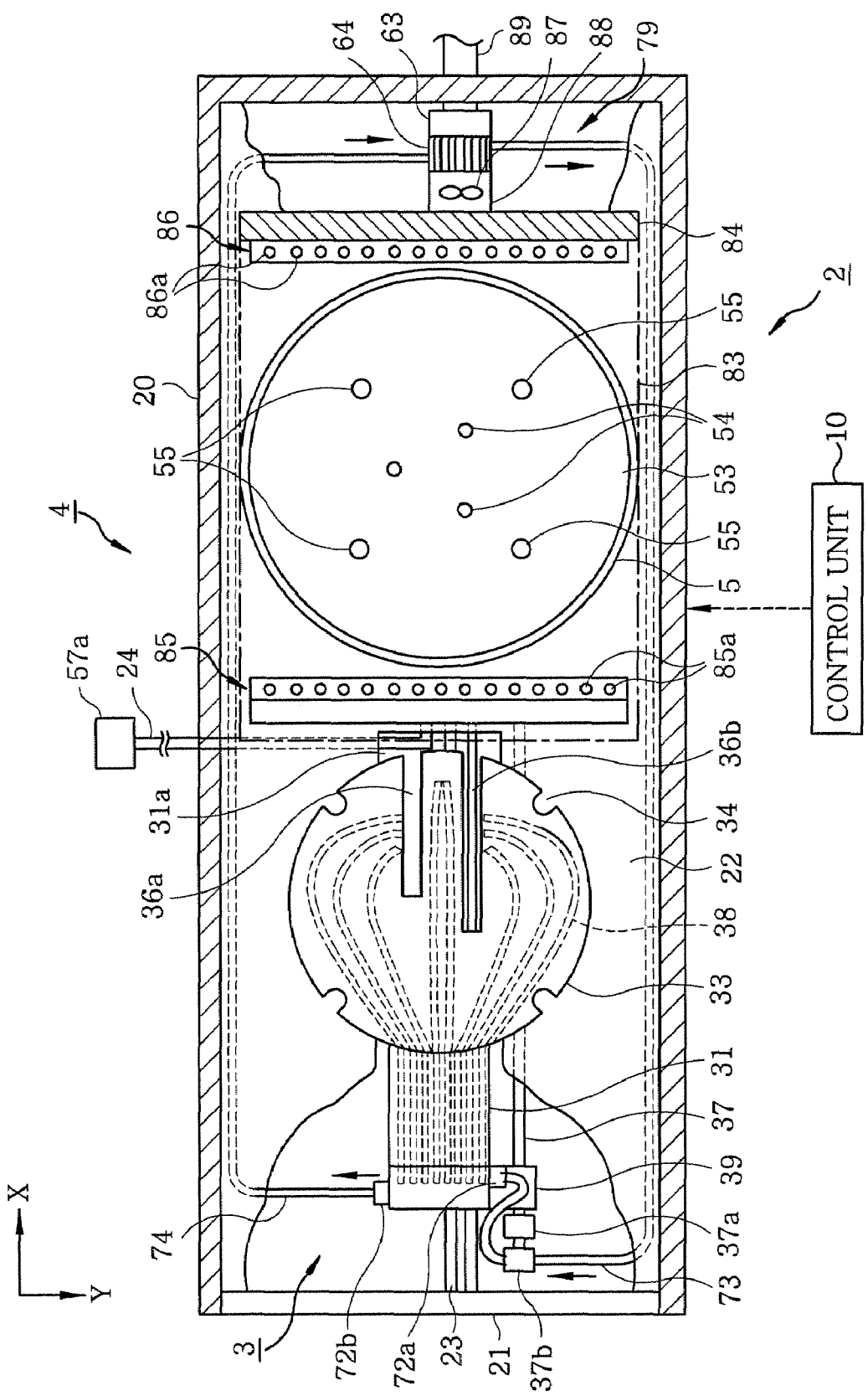
FIG. 2 is a transverse plan view showing the heat treating apparatus.

Hereinafter, as an example of an embodiment of a heat treating apparatus 2 performing a heat treating method according to the present invention, a heat treating apparatus forming a resist film on a surface of a semiconductor wafer (hereinafter, referred to as wafer) W by heat treating the wafer W which is a substrate the surface of which is coated with a liquid resist as a coating liquid will be described with reference to FIGS. 1 and 2.

The heat treating apparatus 2 can be mounted to and separated from a shelf installed in a coating and developing apparatus which will be described later and is stacked in the shelf so as to have multiple steps. Further, in the state in which the heat treating apparatus 2 is separated from the shelf, a housing 20 does not have an upper surface and both side surfaces. On the other hand, in the state in which the heat treating apparatus 2 is mounted to the shelf, a partitioning plate horizontally provided in the shelf and both side surfaces of the shelf respectively correspond to the upper surface and both side surfaces of the housing which is described in the specification. In the embodiment, the term "housing" is used since the embodiment is explained on the basis of the state in which the heat treating apparatus 2 is mounted into the shelf.

The heat treating apparatus 2 includes the housing 20 which is a treatment vessel and the housing 20 is divided into an upper region 20A and a lower region 20B by a partition plate 22. A transfer port 21 for the wafer W is formed on a side wall of the upper region 20A. If the transfer port 21 is assumed to be on the front side, a cooling mechanism 3 is installed on the front side and a heating section 4 is installed on in the inner side. In the upper region 20A, the wafer is moved and the heat treatment is performed to the wafer by the cooling mechanism 3 and a heating section 4.

In the lower region 20B, the operation sections of the cooling mechanism 3 and the heating section 4 and an exhaustion fan 87 are received. An exhaustion chamber 86 for performing the exhaustion of the upper region 20A with the exhaustion fan 87 is provided on the inner side of the partition plate 22. The exhaustion chamber 86 is formed along the widthwise direction (the Y direction) of the housing 20 by a polygonal cylindrical body the diameter of which is larger than that of the wafer W. Exhaustion holes 86a including a plurality of small holes are arranged along the lengthwise direction of the exhaustion chamber 86 in the upper surface of the exhaustion chamber 86 so that an atmosphere in the upper region 20A can be sucked into the exhaustion chamber 86 through the exhaustion holes 86a.

Further, an opening 31a for moving the cooling mechanism 3 from the front side to the inner side (the X direction in the Figure) is provided in the partition plate 22.

Figure 3:
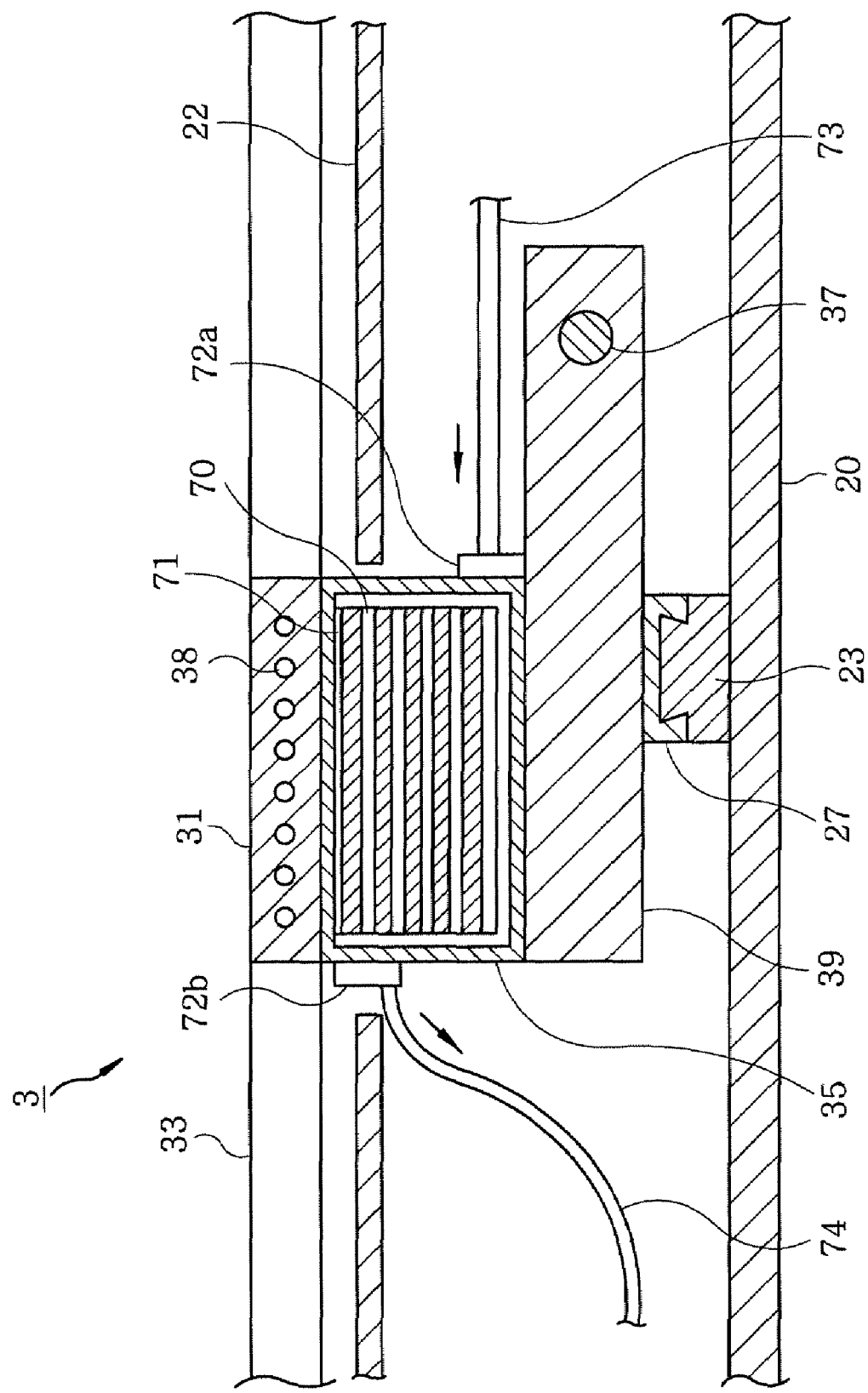
FIG. 3 is a longitudinal side sectional view showing an example of a cooling mechanism of a wafer W provided in the heat treating apparatus.
Figure 4:
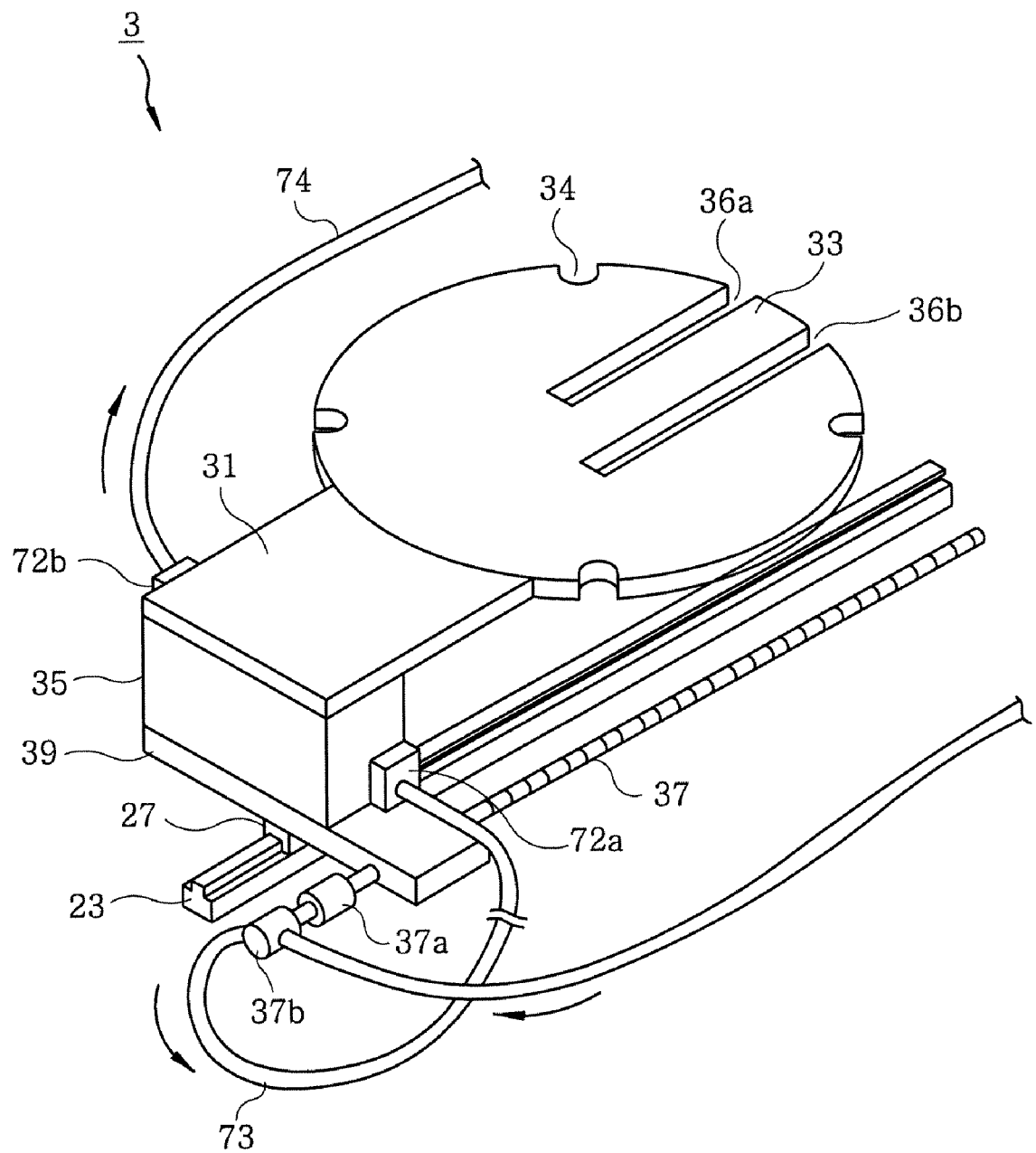
FIG. 4 is a view for explaining an example of the cooling mechanism.

Herein, the cooling mechanism 3 will be described with reference to FIGS. 3 to 5. The cooling mechanism 3 includes a connection bracket 31, a cooling plate 33, a water cooling chamber 35, and a pedestal 39. The cooling mechanism 3 takes a role in transferring the wafer W between a heating plate 53 which will be described later and a conveyer mechanism (not shown) provided outside the heat treating apparatus 2 and in cooling the wafer W. The pedestal 39 is provided with a rail bracket 27, a ball screw mechanism 37, and a motor 37a driving the ball screw mechanism 37. The cooling mechanism 3 can be freely moved in the X direction in the opening 31a along a guide rail 23 extending in the X direction in the FIG. 4 by the ball screw mechanism 37.

The cooling plate 33 has a substantially circular plate-like shape of a thickness of approximately 4 mm and is formed, for example, of aluminum. The cooling plate 33 has the substantially same diameter as the wafer W. A notch 34 and slits 36a and 36b are formed in the cooling plate 33 to transfer the wafer W between the heating plate 53 and the conveyer mechanism (not shown). As shown in FIG. 2, a heat pipe 38 is buried in the cooling plate 33 so as to extend in the form of a leaf vein and one end of the heat pipe 38 is formed on the upper side of the water cooling chamber 35 through the interior of the connection bracket 31. The connection bracket 31 is formed, for example, of copper or aluminum which has an excellent thermal conductivity, thereby increasing the thermal conductivity of the heat pipe 38 installed in the interior of the connection bracket 31.

Here, the heat pipe 38 will be described with reference to FIG. 6A. The heat pipe 38 is a heat conduction device performing thermal transportation using absorption and discharge of latent heat according to evaporation and condensation and is formed by attaching a porous body 302 to the inner wall of a pipe body 301 formed of, for example, aluminum, stainless steel, copper, or the like. The porous body 302 is provided to obtain a capillary phenomenon and is formed, for example, of an iron net woven with a metal thin wire and a metal felt. Both ends of the pipe body 301 are closed and the pressure of the interior thereof is reduced. Further, a volatile liquid (a working fluid) including sodium or naphthalene is sealed in the interior of the pipe body.

When one end side (an evaporation section 303) of the heat pipe 38 is heated, the working fluid is evaporated (heat absorption by an evaporation latent heat) to form a vapor flow and is moved at a high speed in the interior of the pipe body 301 to a condensation section (a low temperature section) 304 with a slight pressure difference. Here, the vapor flow is cooled and condensed by the wall surface of the pipe body 301. Then, heat is transported to the condensation section 304 by discharging the heat using condensation latent heat. The condensed liquid is returned to the evaporation section 303 through the porous body 302 by a capillary phenomenon and repeats a cycle of evaporation, movement, and condensation so that the heat can be continuously transported from one end side of the heat pipe 38 to the other end side thereof to promptly reduce the temperature gradient around the heat pipe 38.

Figure 6A:
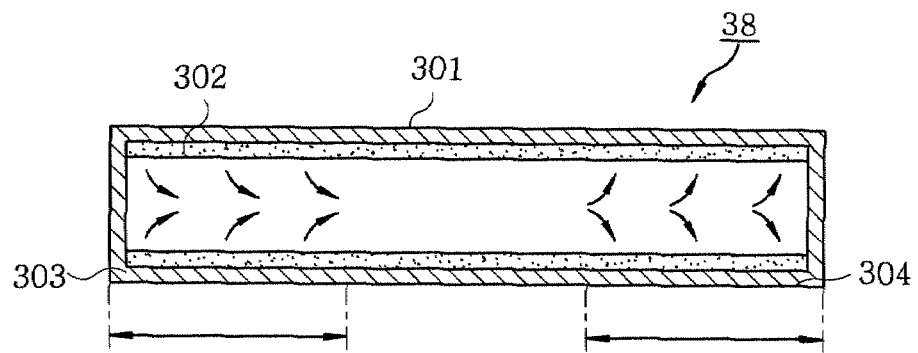
FIG. 6 is a view showing a structure of a heat pipe provided in the cooling mechanism.

By thermally connecting the wafer W mounted to the cooling plate 33 which is positioned at one end of the heat pipe 38 and the water cooling chamber 35 which is positioned at the other end side of the heat pipe 38, the heat pipe 38 shown in FIG. 6A reduces the temperature difference between them. That is, the wafer W mounted to the cooling plate 33, the temperature of which is high after the heat treatment, is promptly cooled by the water cooling chamber 35, the temperature of which is low, through the heat pipe 38 installed in the interiors of the cooling plate 33 and the connection bracket 31. Since the heat pipe 38 is uniformly installed in the cooling plate 33, it can uniformly cool the entire surface of the wafer W.

Further, the heat pipe 38 is not limited to a general cylindrical pipe and may include a wide cavity section. The heat pipe 38 may be formed in the entire surface of the interior of the cooling plate 33. The other end side of the heat pipe 38 may extend from the connection bracket 31 to the cooling chamber 35 so as to make contact with the water cooling chamber 35. That is, it would be good if the other end side of the heat pipe 38 is directly or indirectly cooled by the water cooling chamber 35.

Figure 5:
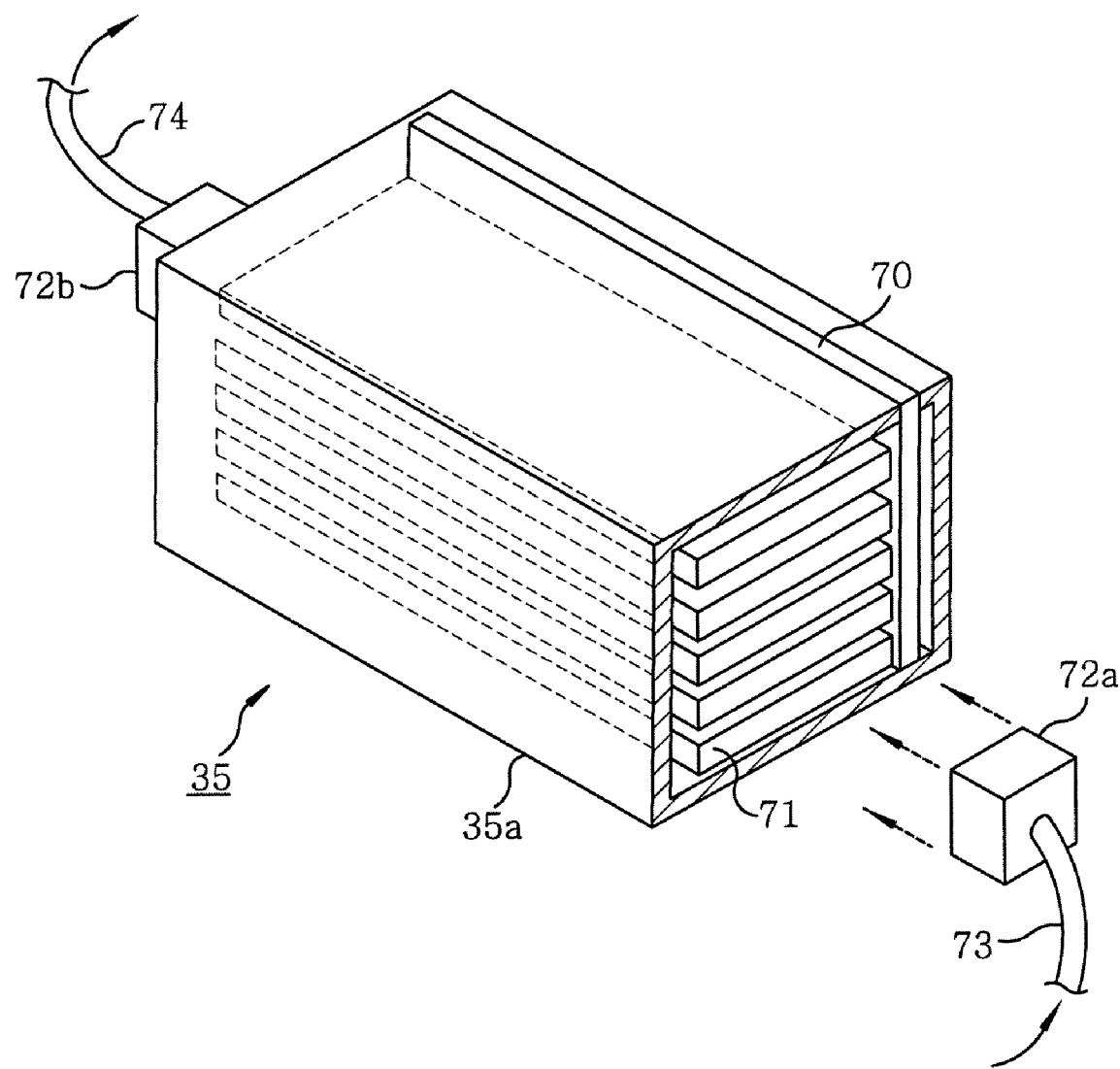
FIG. 5 is a view for explaining an example of a water cooling chamber provided in the cooling mechanism.

On the other hand, a plate-like heat conducting heat pipe 70 is vertically provided as shown in FIG. 5. The upper end of the heat conducting heat pipe 70 forms the same surface with the upper surface of a ceiling section of the housing 35a of the water cooling chamber 35. The heat conducting heat pipe 70 makes contact with the outer wall of the connection bracket 31 so as to be close to one end of the heat pipe 38 installed in the connection bracket 31.

Further, the lower side of the heat conducting heat pipe 70 is submerged in the water cooling chamber 35 so as to make contact with the cooling liquid. A plurality of, e.g. ten heat radiating plates 71 formed, for example, of aluminum are horizontally disposed on a side surface of the heat conducting heat pipe 70 to promptly radiate heat of the heat conducting heat pipe 70 into the cooling liquid.

The housing 35a is sealed and a cooling medium, e.g. a cooling liquid is introduced from a supply pipe 73 via a check valve 72a and is discharged to a discharge pipe (heat pipe) via the check valve 72b. The cooling liquid which has been discharged to a discharge pipe 74, is returned to the supply pipe 73 via a circulation passage 79 extending from the discharge pipe 74 to the inner side of a heating section 4. A circulation pump 37b is installed in the heat treating apparatus 2 to circulate the cooling liquid and, in this example, is a mechanism operated by the rotation of the motor 37a driving a ball screw mechanism 37. All or some of the cooling liquid in the water cooling chamber 35 is substituted when the cooling mechanism 3 is moved. That is, in this example, when the cooling mechanism 3 is moved to the front side in the X direction of FIG. 2, the cooling liquid in the water cooling chamber 35 is substituted. Further, in the other cases, i.e. when the cooling mechanism 3 is stopped and is moved to the inner side in the X direction of FIG. 2, the cooling liquid in the water cooling chamber 35 is prevented by the check valves 72a and 72b from reversely flowing to the supply pipe 73.

Since the heat conducting heat pipe 70 has a function of promptly reducing the temperature gradient of the vicinity thereof in the same way of the heat pipe 38, the heat transferred from one end of the heat pipe 38 close to the upper side of the heat conducting heat pipe 70 can be diffused into the water cooling chamber 35 on the lower side That is, the end of the heat pipe 38 can be promptly cooled by cooling the heat conducting heat pipe 70 by the heat radiating plates 71 and the cooling liquid flowing in the water cooling chamber 35.

Figure 6B:
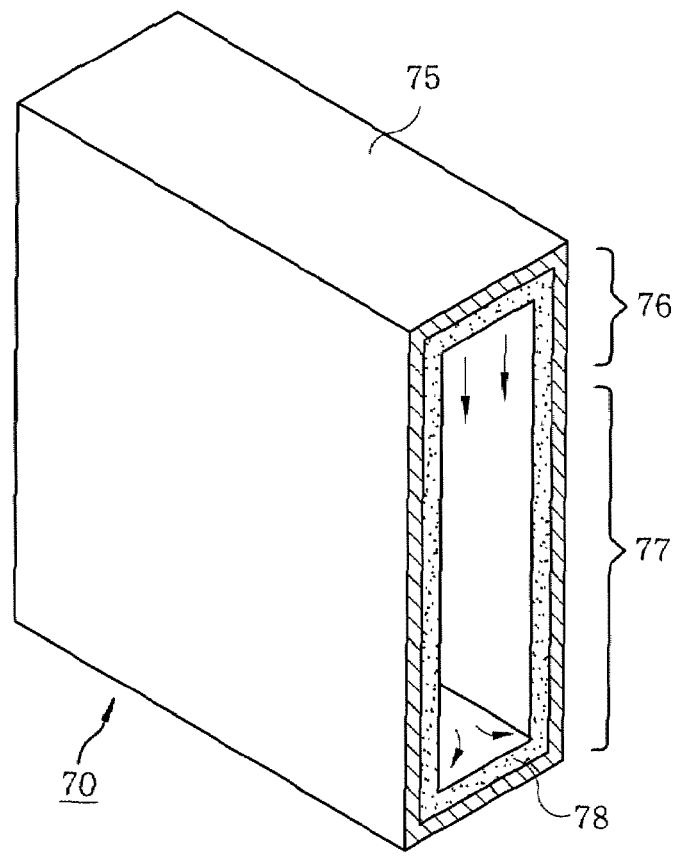

As shown in FIG. 6B, the heat conducting heat pipe 70 has a parallelepiped-shaped housing 75 and performs the same function as the heat pipe 38 except that a porous body 78 is attached to the entire surface of the inner wall of the housing 75 so that an upper portion of the housing 75 functions as an evaporation section 76 and a lower portion thereof functions as a condensation section 77. That is, in the heat conducting heat pipe 70, the working fluid which is evaporated at the evaporation section thereof is moved to the lower side by a slight pressure difference and is cooled and condensed by the condensation section 77. Then, the condensed working fluid is returned to the upper portion along the porous body 78 to be evaporated again.

In this example, although one end of the heat pipe 38 is located on the right side of an upper portion of the water cooling chamber 35 and is close to the heat conducting heat pipe 70, it is not limited thereto and may be located on the left side of an upper portion of the water cooling chamber 35 so that cooling can be performed by the housing 35a of the water cooling chamber 35 as well as by the heat conducting heat pipe 70.

The number of the heat conducting heat pipes 70 is not limited to one and may be plural to cool the heat pipe 38. Further, the shape of the heat conducting heat pipe 70 is not limited to the plate-like shape and may includes a plurality of lines of cylindrical heat pipes. Although the heat conducting heat pipe 70 is vertically provided in this example, it may be horizontally provided at an upper portion of the water cooling chamber 35 so that the upper surface of the heat conducting heat pipe 70 is close to one end of the heat pipe 38 and the lower surface thereof makes contact with the cooling liquid. Further, in this case, a plurality of heat radiating plates 71 may be provided on the lower surface of the heat conducting heat pipe 70. That is, it does not matter if one end of the heat conducting heat pipe 70 is close to one end of the heat pipe 38 and the other end of the heat conducting heat pipe 70 is cooled by the water cooling chamber 35.

Figure 7A:
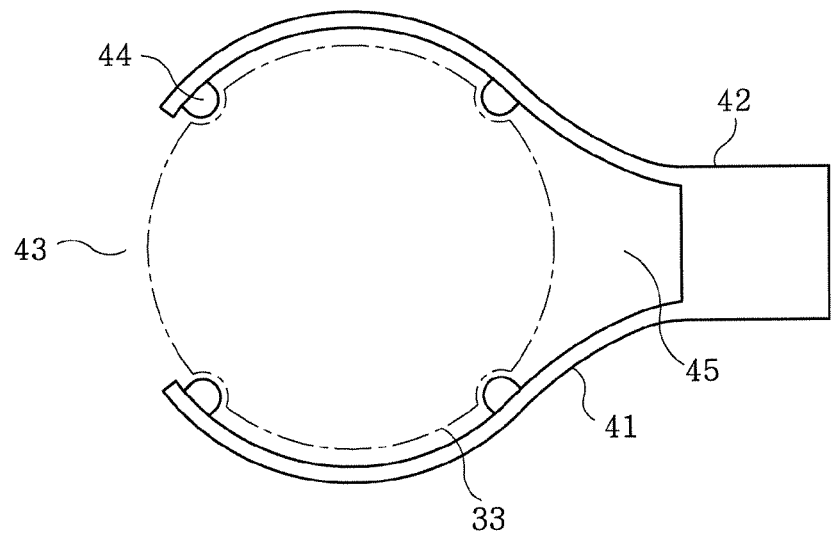
FIG. 7 is a view for explaining a conveyer mechanism transferring a wafer with respect to the cooling mechanism.
Figure 7B:
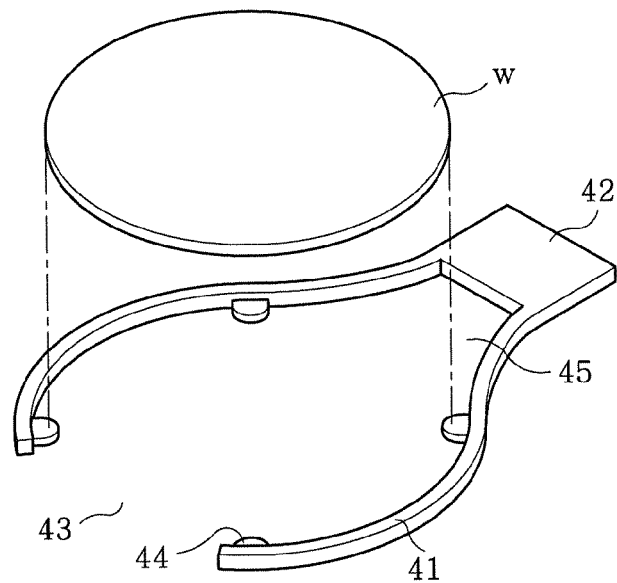

As shown in FIG. 7, the conveyer mechanism transferring the wafer W to the cooling plate 33 has a horizontal horseshoe-shaped conveyance arm 41 and a conveyance body 42 supporting the conveyance arm 41. The diameter of the inner periphery of the conveyance arm 41 is slightly larger than that of the cooling plate 33 and four bosses 44 facing the center of the conveyance arm 41 is provided on the inner peripheral surface thereof to maintain the wafer W on the bosses 44, as shown in FIG. 7B. A space 45 is formed between the wafer W and the conveyance body 42. When the wafer W is transferred to the cooling plate 33, the conveyance body 42 does not make contact with the water cooling chamber 35. For convenience sake, the space 45 is illustrated in a small size in FIG. 7B. The conveyance arm 42 can be ascended and descended and can be freely moved forward and rearward by a drive mechanism (not shown) via the conveyance body 42, so that when the wafer W is mounted to the cooling mechanism 3, it enters the housing 20 through the transfer port 21. The notches 34 of the outer periphery of the cooling plate 33 are provided at positions corresponding to the bosses 44 of the conveyance arm 41.

As shown in FIG. 7A, as the conveyance arm 41 is descended so as to be covered from the upper side with respect to the cooling plate 33, the conveyance arm 41 passes the lower side of the cooling plate 33 and the wafer W on the conveyance arm 41 is mounted to the cooling plate 33. Then, the conveyance arm 41 is retreated to the front side so that the notches 43 can be released from the connection bracket 31 and is withdrawn from the housing 20.

Next, the heating section 4 will be described. As shown in FIG. 1, the heating section 4 is provided between a gas discharge section 85 and an exhaustion chamber 86. A circular hole is provided in the partition plate 22 and a heating plate support member 5, which is a flat cylindrical insulation body supported by a pole 51, is buried in the hole.

A heating plate 53 having bosses 55 supporting the rear surface of the wafer W is installed at an upper portion of the heating plate support member 5. The heating plate 53 has a size larger than the wafer W. Ring-shaped heaters 53a having different sizes are concentrically provided on the lower surface of the heating plate 53 as a heating means of the wafer W.

For example, the heating values of the heaters 53a are controlled through a power supply section (not shown) on the basis of the outputs from a plurality of temperature detecting sensors (not shown) provided on the lower surface of the heating plate 53 to a control section 10 which will be described later. The heating plate support member 5 restrains the power consumption for heating the heating plate by restraining the heat radiation of the heating plate 53. A plurality of holes 54 are punched at central portions of the heating plate support member 5 and the heating plate 53. The wafer W can be transferred between the heating plate 53 and the cooling plate 33 by vertically ascending and descending support pins 26a connected to a drive mechanism 26 provided on the lower side of the heating plate support member 5 through the holes 54.

An upper plate 83 fixed to the upper surface of the exhaustion chamber 86 by a support section 84 is provided on the upper side of the heating plate support member 5 to regulate the flow of the gas flowing between the heating plate 53 and the upper plate 83 from the front side to the inner side. An opening 86b is formed at a widthwise central portion on the front side of the exhaustion chamber 86 in the lower region 20B and an opening 86c is also formed on the rear side opposite to the opening 86b in the exhaustion chamber 86. The exhaustion chamber 86 is communicated via the opening 86c with the housing 88 in which the exhaustion fan 87 is accommodated and an exhaustion duct 63 having the approximately same size as the corresponding ejection opening is installed on the rear side (the ejection side of the exhaustion fan 87) of the exhaustion fan 87 via a heat radiating fin unit 64 which will be described later.

One side end of an exhaustion pipe 89 is connected to the exhaustion duct 63 and the other side end of the exhaustion pipe 89 is connected to an exhaustion passage (not shown) of a factory which is provided outside the housing 20 by penetrating the wall surface of the housing 20. The gas flowing in the upper region 20A is discharged by the exhaustion fan 87 from the exhaustion duct 63 to the outside of the housing 20 via the exhaustion chamber 86. The gas flowing in the lower region 20B through the opening 86b is sucked by the exhaustion fan 87 and is discharged to the outside of the housing 20 in the same way as the upper region 20A.

By forming flows in this way, the vapor of the solvent of the liquid resist coated on the wafer W in the upper region 20A and the vapor component generated by evaporating some of the resist component are sucked by the exhaustion fan 87 and particles generated by the drive mechanism 26 and the ball screw mechanism 37 in the lower region 20B is sucked by the exhaustion fan 87 together with the flow in the lower region 20B and is discharged outside from the exhaustion duct 63.

A gas supply passage 24 is connected to a central portion of the gas discharge section 85 in the Y axis direction and the gas supply passage 24 penetrates the wall surface of the housing 20 and is connected to a gas supply source 57a provided outside the housing 20. A clean purge gas, e.g. an inert gas is stored in the gas supply source 57a. When the purge gas is supplied from the gas supply source 57a to the heating section 4 via the gas supply passage 24 and the gas discharge section 85, the heated heating plate 53 and wafer W can be cooled. The purge gas is discharged by the exhaustion fan 87 to the outside of the housing 20 via the exhaustion chamber 86.

Figure 8:
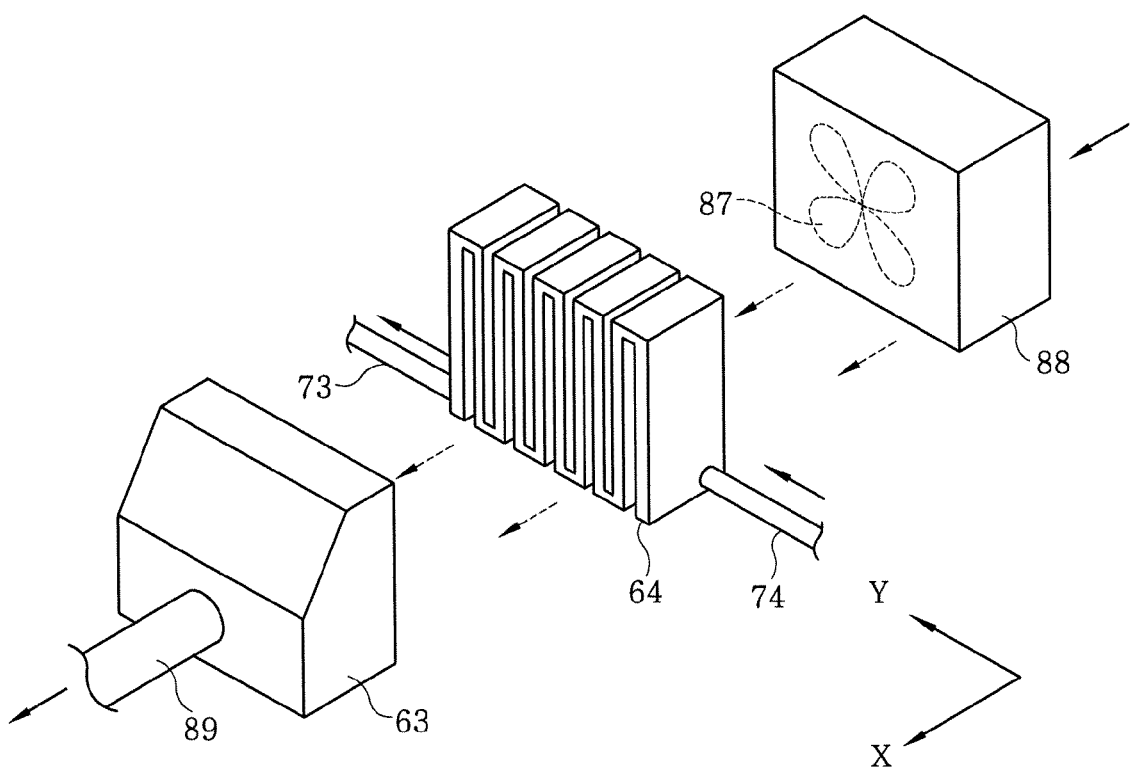
FIG. 8 is a view for explaining an example of a heat radiating fin unit provided in a circulation passage of a cooling liquid.

On the other hand, as shown in FIG. 8, a heat radiating fin unit 64 is installed in the circulation passage 79 between the exhaustion fan 87 and the discharge duct 63. The cooling liquid discharged through the discharge pipe 74 from the water cooling chamber 35 is cooled by an exhaustion gas injected from the exhaustion fan 87 when the cooling liquid flows in the bellows-shaped heat radiating fin unit 64 formed, for example, of aluminum and is returned to the water cooling chamber 35 via the supply pipe 73. Further, the heat radiating fin unit 64 is covered with a housing (not shown) and the total quantity of the gas injected from the exhaustion fan 87 to the heat radiating fin unit 64 is discharged from the exhaustion duct 63 to the outside of the housing 20.

The control section 10 has a program storage section formed, for example, by a computer. In the program storage section is stored a program realized, for example, by a software including instructions for performing cooling of the wafer W, transfer of the wafer W, and heating of the wafer W, which are the operations of the heat treating apparatus 2. The control unit 10 controls the operations of the heat treating apparatus 2, which will be described later, by reading the corresponding program by the control section 10. Further, the program is stored in the program storage section in the state in which it is received in a record medium such as a hard disc, a compact disc, a magneto-optical disc, and a memory card.

Next, a heat treating method using the heat treating apparatus 2, which is an embodiment of the present invention, will be described. If the wafer W, a surface of which is coated with a liquid resist, is conveyed into the housing 20 via the transfer port 21 by the conveyance mechanism of the wafer W, which has the conveyance arm 41, and is mounted to the cooling plate 33, the conveyance arm 41 is retreated from the housing 20. On the other hand, a surface of the heating plate 53 remains heated by the heater 53a at a predetermined temperature, e.g. 130 degrees Celsius.

If the cooling plate 33 maintaining the wafer W is moved to the heating plate 53, the support pins 26a are ascended to support the rear surface of the wafer W mounted to the cooling plate 33. The wafer W is mounted onto the bosses 55 of the heating plate 53 by retreating the cooling mechanism 3 to the home position (the left end position of FIG. 1) and lowering the support pins 26a, and is heated.

Exhaustion is performed by the exhaustion fan 87 via the exhaustion chamber 86 in the housing 20 and the flow is regulated by the upper plate 83 and the heating plate 53 to form flows proceeding from the front side to the inner side. Therefore, the solvent of the liquid resist coated on the wafer W is evaporated by the heat of the heating plate 53 and some of the resist component is evaporated to suck the solvent vapor and the vapor component to the exhaustion duct 63 together with the flows. Further, the particles generated in the operation sections of the cooling mechanism 3 and the heating section 4 in the lower region 20B is sucked into the exhaustion duct 63 together with the flows proceeding from the front side to the inner side.

After the wafer W has been heated for a predetermined period of time, the support pins 26a are ascended to support the wafer W. Then, as mentioned above, it would be good if N2 gas as the purge gas is supplied from the gas supply source 57a via the gas discharge section 85 to cool the wafer W and the heating plate 53.

Then, the cooling mechanism 3 is moved to the heating plate 53 again from the home position and the wafer W is mounted to the cooling plate 33. Thereafter, the cooling mechanism 3 is returned to the home position. If the wafer W is mounted to the cooling plate 33, the heat of the wafer W is conducted to the cooling plate 33 and the cooling plate 33 accumulates heat to increase the temperature thereof.

As mentioned above, the heat is transferred to the water cooling chamber 35 via the heat pipe 38 buried in the cooling plate 33, the heat conducting heat pipe 70, and the heat radiating plate 71 and is diffused into the cooling liquid. Further, the conveyance mechanism approaches the wafer W to take the wafer W according to the conveyance schedule and the wafer W is cooled by the cooling plate 33 until the conveyance mechanism takes the wafer W.

The conveyance arm 41 of the conveyance mechanism ascends the wafer W on the cooling plate 33 from the lower side to take the wafer W and then conveys the corresponding wafer W outside the housing 20. Thereafter, the following wafer is conveyed to the heat treating apparatus 2 by the conveyance mechanism, the same heat treatment is performed to the following wafer W.

On the other hand, as mentioned above, when the cooling mechanism 3 is moved from the inner side to the front side, the cooling liquid, the temperature of which has been increased by the heat of the wafer W, is discharged from the discharge pipe 74 to the circulation passage 79 by operating the circulation pump 37b by the drive of the ball screw mechanism and is returned to the water cooling chamber 35 via the supply pipe 73. Then, the heat radiating fin unit 64 is cooled by injecting a discharge flow by the exhaustion fan 87 provided to the housing 20 so that the heat of the cooling liquid flowing in the heat radiating fin unit 64 is transferred to the discharge flow.

In the heat treating apparatus 2 according to the embodiment of the present invention, a pipe of the cooling liquid between the heat treating apparatus 2 and the outside is excluded by providing the circulation passage 79 and the circulation pump 37b circulating the cooling liquid and further by providing the heat radiating means radiating the heat of the cooling liquid in the circulation passage 79. Accordingly, the pipe of the cooling liquid is not necessary when the heat treating apparatus 2 is mounted to and separated from the installation place of the coating and developing apparatus. Further, when the heat treating apparatus 2 is separated from the installation place, the heat treating apparatus 2 is easily maintained and exchanged since there is not a trouble of leaking the cooling liquid.

Further, since the cooling liquid flowing in the heat radiating fin unit 64 is cooled by providing the heat radiating fin unit 64 on the inner side of the heat treating apparatus 2 as the heat radiating means and disposing the exhaustion fan 87 and the exhaustion chamber 86 so that the discharge flow flowing in the housing 20 can be injected to the heat radiating fin unit 64. As a result, a mechanism for performing radiation of the cooling liquid does not need to be installed newly, thereby scaling down the heat treating apparatus 2.

Further, since the circulation pump 37b is operated by a motor 37a such as the ball screw mechanism 37 which is a drive source for moving the cooling mechanism 3, a power source or a drive section for the circulation pump 37b does not need to be installed separately, thereby scaling down the heat treating apparatus 2.

Then, in scaling down the cooling mechanism 3 for cooling the wafer W, the process conditions such as the size of a member including the length of the changeable heat pipe 38 and the flow rate of a gas can be considered variously. For example, in a general heat treating apparatus 2, in the case in which pure water is used as a cooling liquid, the amount of heat of 500 Joule can be cooled per one minute under the condition of the flow rate of the pure water of less than 0.8 l/min and the flow rate of an exhaust gas of less than 0.2 $m^3$/min. Therefore, the heat treating apparatus 2 can be scaled down by reducing the sizes of the circulation pump 37b and the exhaustion fan 87 which has such small capacity. Here, the cooling rate of 500 J/min is equivalent to that of cooling one wafer W having a diameter of 300 mm, which has been heated to 150° C., down to 23° C. for thirty seconds.

Figure 9:
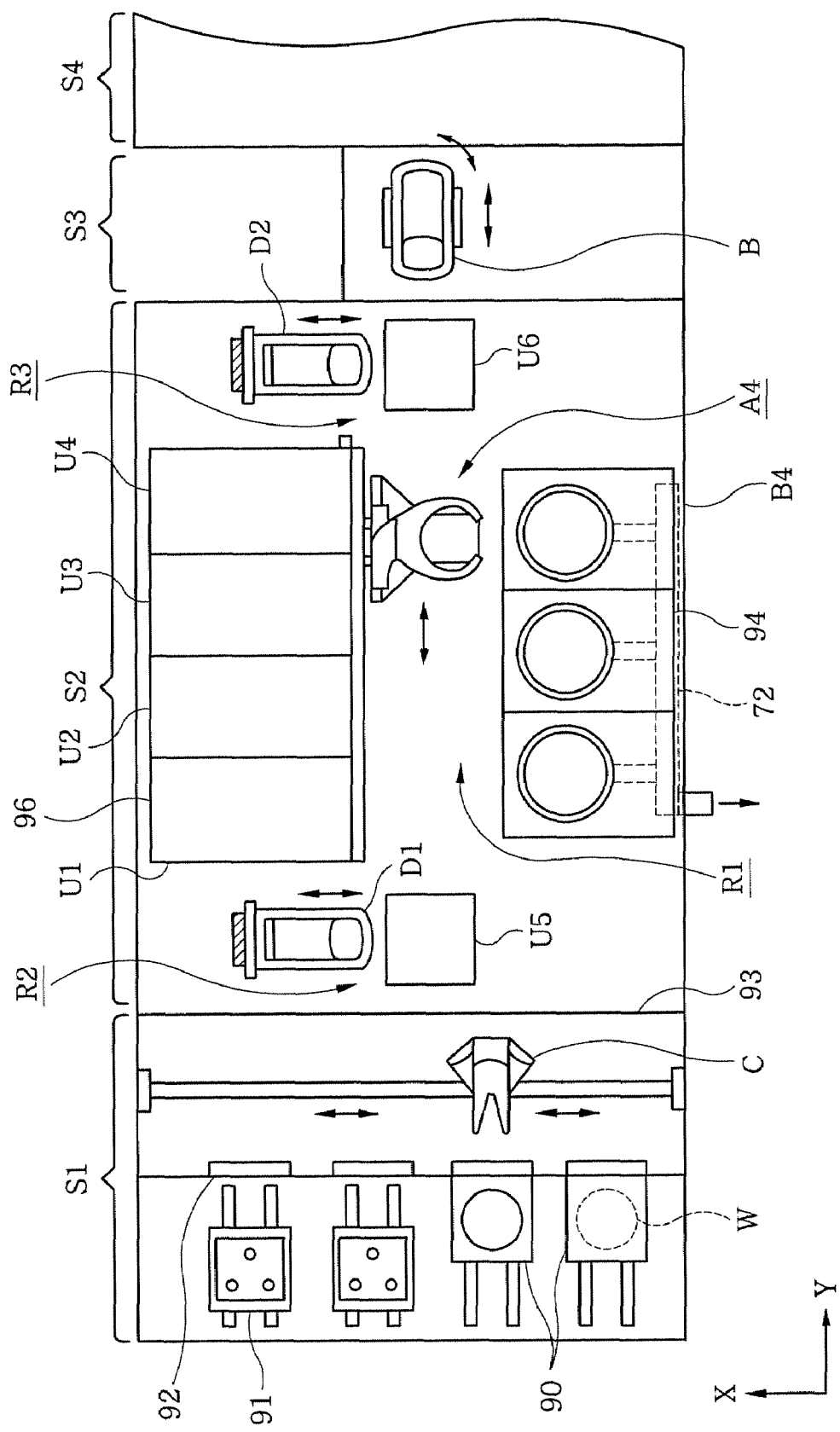
FIG. 9 is a plan view showing a coating and developing to which a heat treating apparatus is applied.
Figure 10:
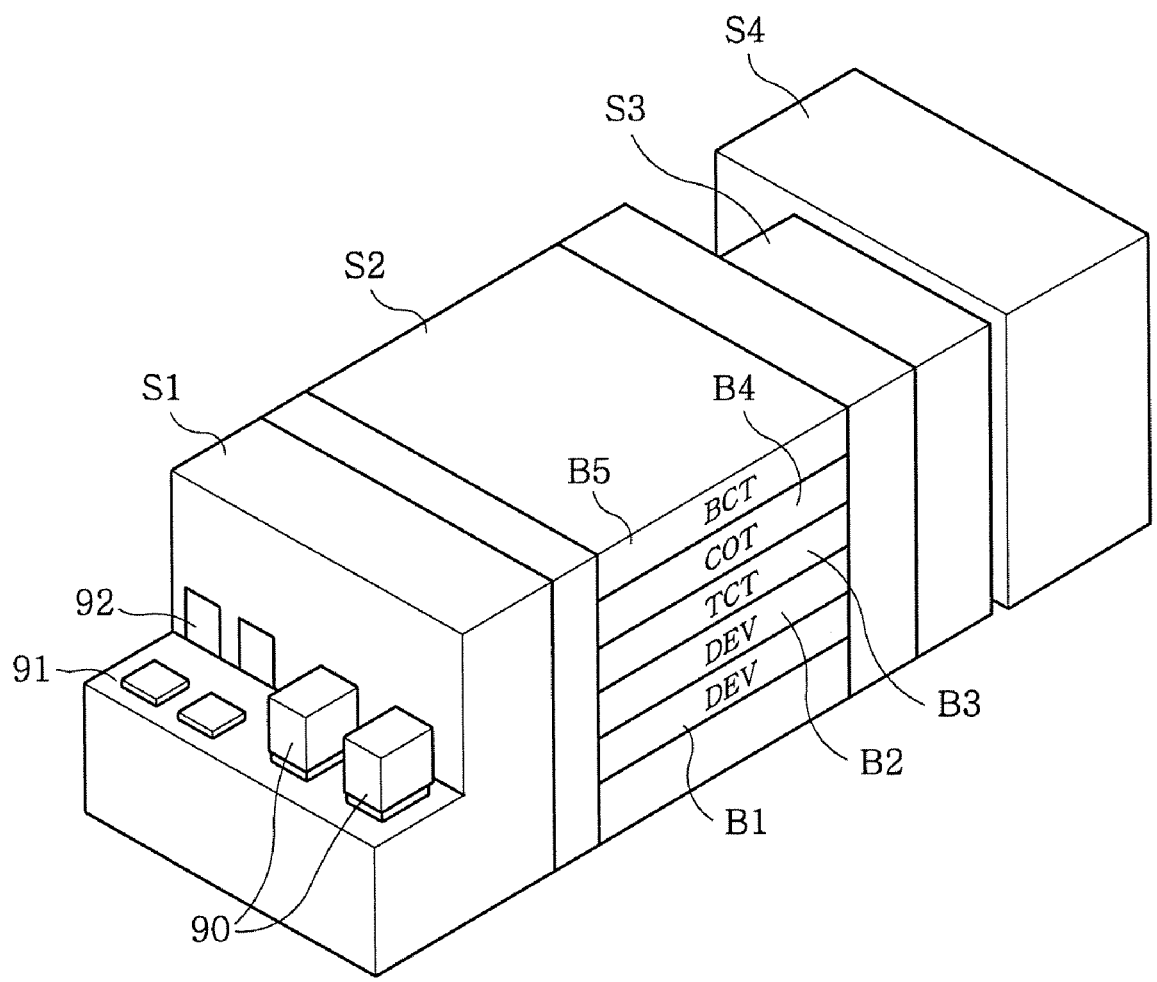
FIG. 10 is a perspective view showing the coating and developing apparatus.
Figure 11:
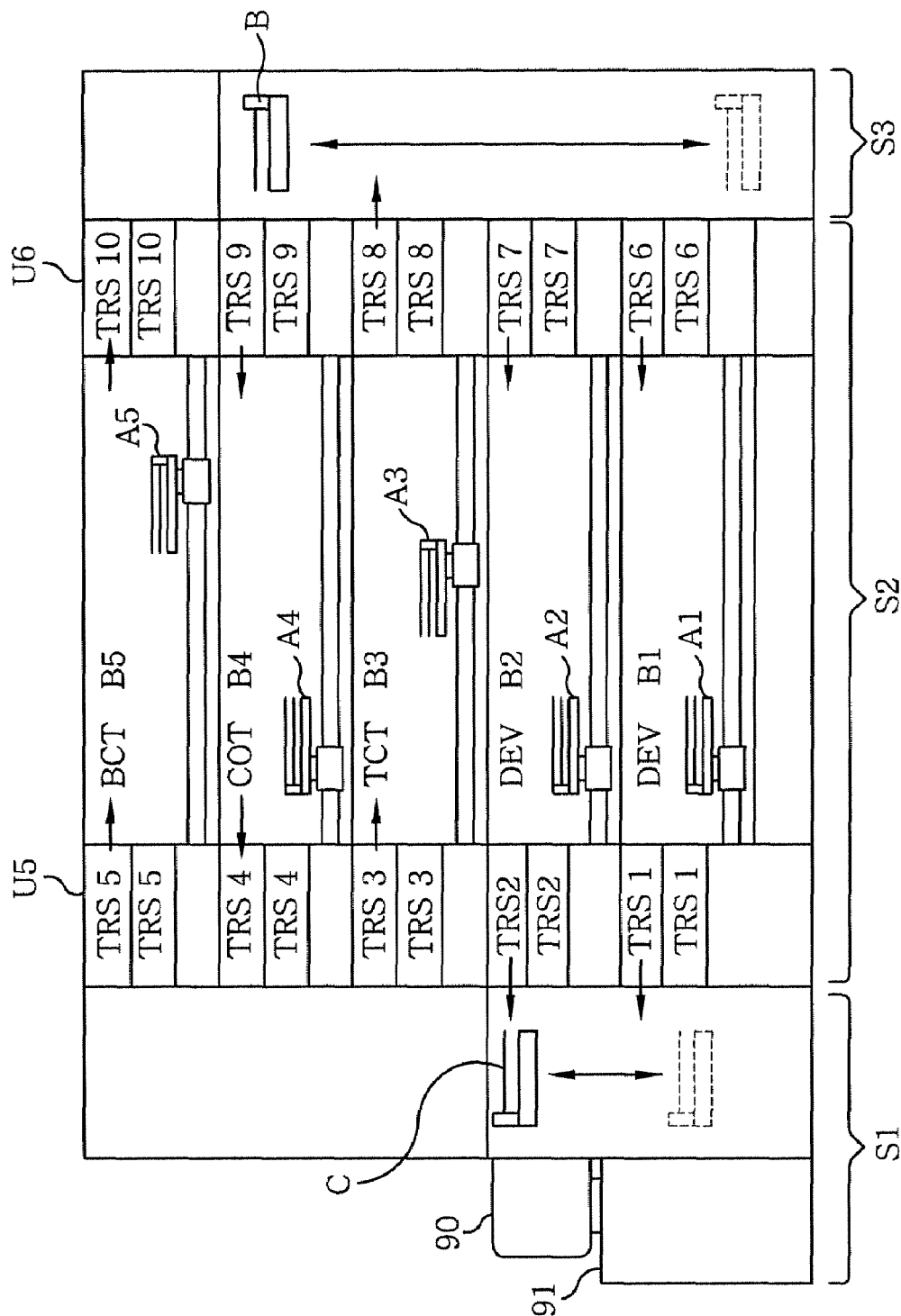
FIG. 11 is a side sectional view showing the coating and developing apparatus.
Figure 12:
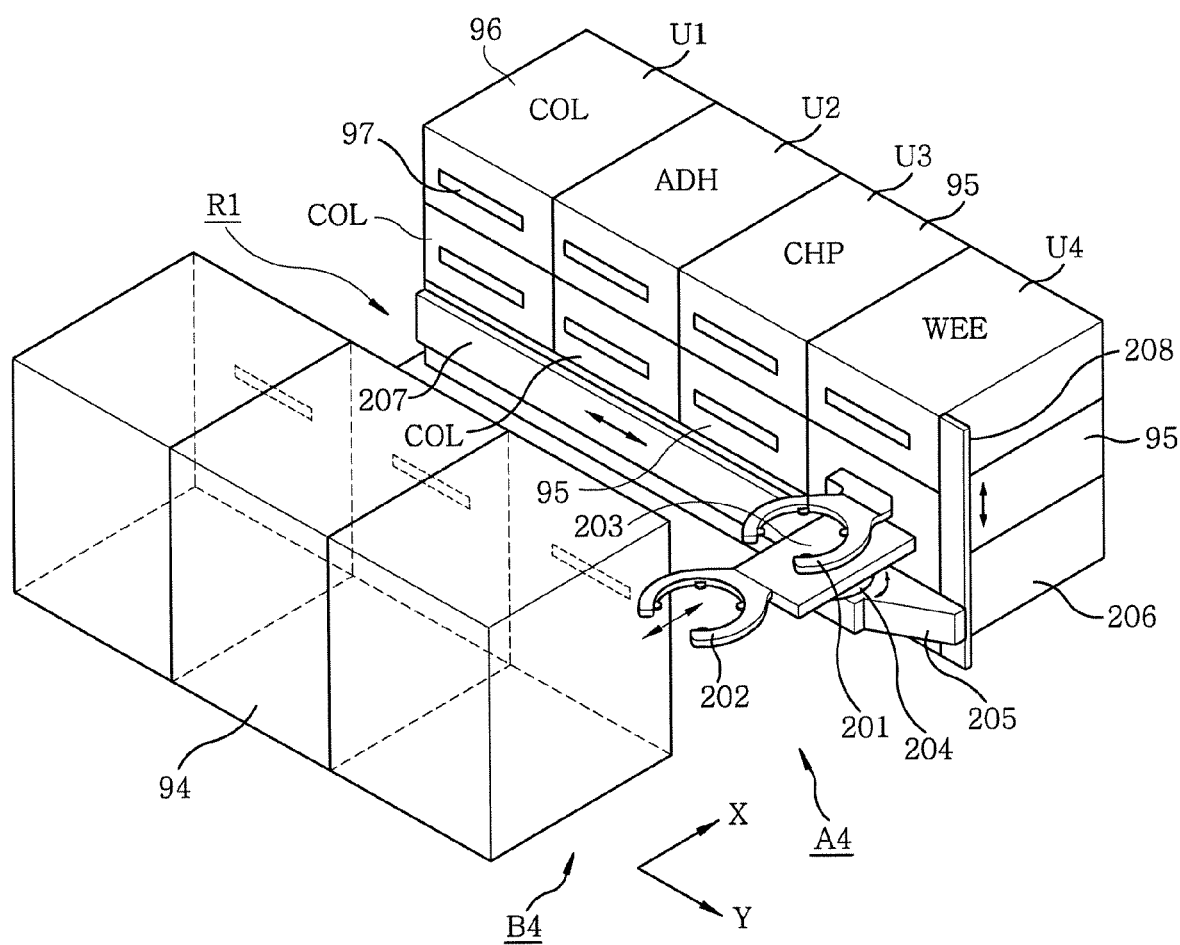
FIG. 12 is a perspective view showing a coating unit, a shelf unit, and a conveyance means of the coating and developing apparatus.
Figure 13:
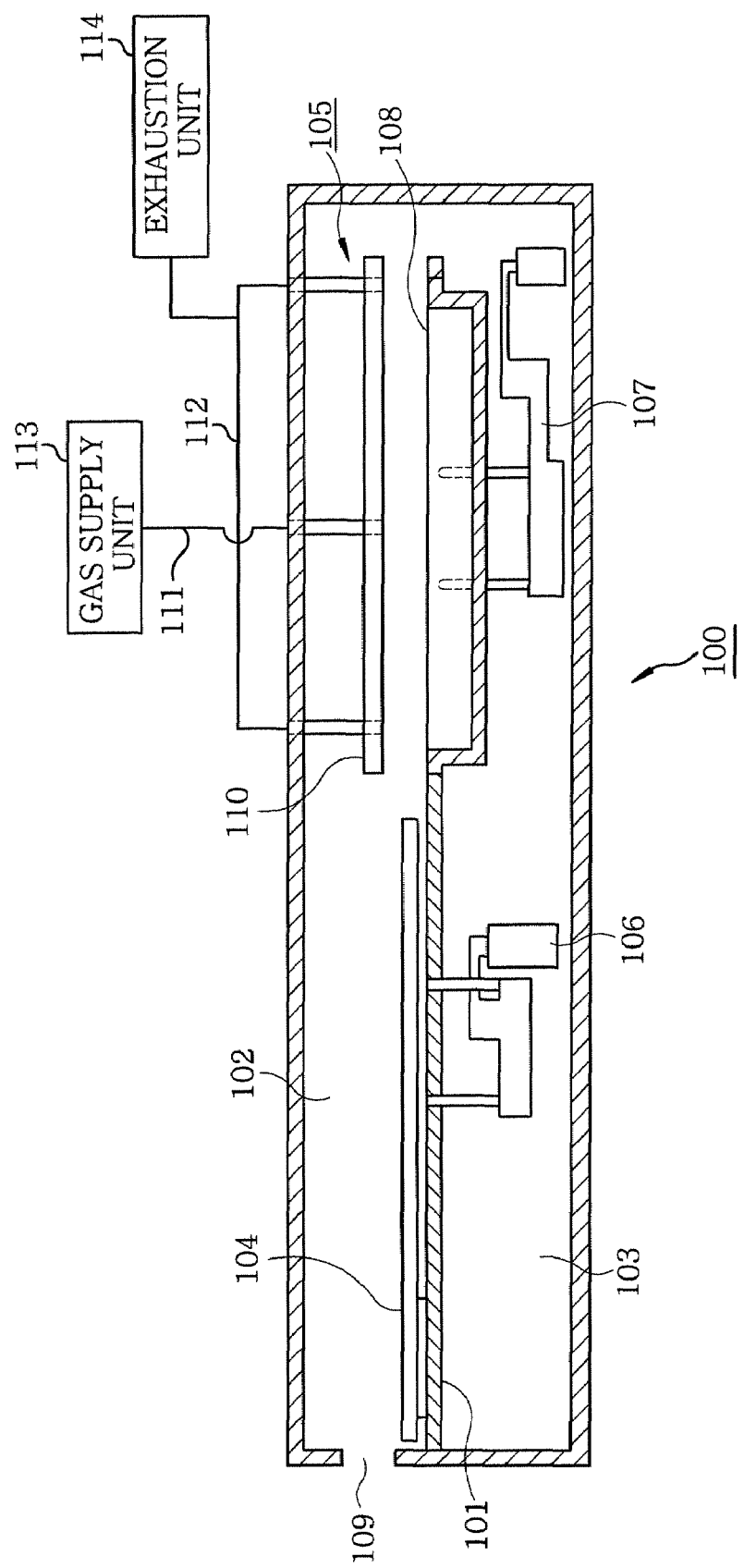
FIG. 13 is a view showing a conventional heat treating apparatus.

Hereinafter, there will be described a coating/developing device to which the above described heat treating apparatus 2 is applied in accordance with a first preferred embodiment of the present invention. FIG. 9 is a plan view of a resist pattern forming apparatus to which the coating/developing device; FIG. 10 illustrates a schematic perspective view thereof; FIG. 11 describes a schematic side sectional view thereof; and FIG. 12 describes structure around a transferring area R1 which is provided in the resist pattern forming apparatus. Such apparatus includes a carrier block S1 for loading/unloading a carrier 90 accommodating therein, e.g., 13 wafers in a sealing state, a processing block S2 in which a plurality of, e.g., 5 unit blocks B1 to B5 are vertically arranged and an interface block S3; and an exposure device S4.

The carrier block S1 includes a mounting table 91 of carrier 90, an opening/closing member 92 provided on a wall and a transfer arm C for unloading wafers W from the carrier 90 via the opening/closing member 92.

The processing block S2 surrounded by a housing 24 is connected to the inner side of the carrier block S1. The processing block S2 is divided, from the bottom, into a first and a second unit block (DEV layer) B1 and B2 for performing a developing process; a third unit block (TCT layer) B3 for forming a antireflection coating on a resist film; a fourth unit block (COT layer) B4 for coating liquid resist; and a fifth unit block (BCT layer) B5 for forming a antirefleciton film under the resist film.

Each of the unit blocks B1 to B5 is provided with a liquid processing unit for coating a liquid chemical on the wafer W, various processing units of heating/cooling system for performing a pre-treatment and a post-treatment of the processing by the liquid processing unit, and main arms A1 to A5 as dedicated transfer units for transferring the wafer W between the liquid processing unit and the processing units of heating/cooling system.

Since the respective unit blocks B1 to B5 are formed in approximately same layouts, as an example, the COT layer B4 will be described in detail with reference to FIG. 9 hereinafter. To be specific, there are provided a coating unit 94 having a plurality of coating units for coating a resist and four rack units U1 to U4 having multistory thermal processing units of a heating/cooling system at the both sides of a transferring area R1. The rack units U1 to U4 include two-story thermal processing units for carrying out a pre-treatment and a post-treatment of a processing performed by the coating unit 94.

The aforementioned the units for performing the pre-treatment and the post-treatment includes a cooling unit (COL) for adjusting the wafer W to a specific temperature before a liquid resist coating process; an adhesion unit (ADH) for performing a hydrophobic process on the surface of the wafer W before the liquid resist coating process; a heating unit (CHP) 95, referred to as a pre-baking unit, for performing a heat treatment of the wafer after the liquid resist coating process; a wafer peripheral edge exposure device (WEE) for selectively exposing an edge portion of the wafer W. In this embodiment, the aforementioned heat treatment apparatus 2 which is described in FIGS. 1 to 8 corresponds to the heating unit 95. Furthermore, the processing units such as the cooling unit (COL) and the heating unit (CHP) 95 are accommodated in the respective processing vessels 96, and the rack units U1 to U4 includes the processing vessels 96 which are stacked in two layers. Formed at a surface of each processing vessel 96 facing the transferring area R1, is a transferring opening through which the wafer W is loaded thereinto and unloaded therefrom. In this embodiment, the heating unit (CHP) 95 is stacked as the rack unit U3 and further, is also included in the rack unit U4.

A main arm A4 has two arm members which are capable of being operated independently and is configured to be movable back and forth, vertically and in the Y-axis direction and also rotatable about its vertical axis. Furthermore, reference numeral 201 and 202 in FIG. 12 denotes transferring arms and reference numeral 203 denotes a transferring base. Reference numeral 204 denotes rotation mechanism which rotates the transferring base 203 and reference numeral 205 denotes a supporting unit which freely moves along a Y-axis rail 207 and freely moves up and down along an elevation rail 208. In addition, reference numeral 206 denotes a supporting unit for supporting the rack units U1 to U4.

An area adjacent to the carrier block S1 in the transferring area R1 serves as a first wafer transferring area R2. As shown in FIGS. 9 and 11, there is provided a rack unit U5 at a position in the area R2 where each of the transfer arm C and the main arm A4 can have an access as well as a first conveyance arm D1 for transferring the wafer W to and from the rack unit U5.

As shown in FIG. 11, the rack unit U5 includes a first transfer stages TRS1 to TRS5, wherein respective unit blocks B1 to B5 contains one or more, e.g., two stages as shown in this embodiment, so that the wafer W can be transferred between the main arms A1 to A5 of the respective unit blocks B1 to B5.

Further, an area adjacent to an interface block S3 in the transferring area R1 serves as a second wafer transferring area R3. As illustrated in FIG. 9, there are provided a rack unit U6 at a position where the main arm A4 can have an access and a second conveyance arm D2 for transferring the wafer W to and from the rack unit U6.

As depicted in FIG. 11, the rack unit U6 includes a second transfer stages TRS 6 to TRS 10 so that the wafer W can be transferred between the main arms A1 to A5 of the respective unit blocks B1 to B5.

Hereinafter, the other unit blocks will be described briefly. DEV layers (B1 and B2) are configured substantially same as a COT layer (B4). The differences are as follows: The DEV layers B1 and B2 are provided with a developing unit including a plurality of developing units for performing a developing process on the wafer W. The rack units U1 to U4 are provided with heating unit (PEB) called as, e.g., a post exposure baking unit, for heating the wafer W after the exposure, cooling unit (COL) for adjusting the temperature of the wafer W to a predetermined level after the processing by the heating unit (PEB), and a heating unit (POST) called as, e.g., a post baking unit for heating the wafer W to evaporate moisture therein after the developing process.

In addition, the heat units which are provided in the DEV layers (B1 and B2) has same configuration as the heat unit 95 which is provided in the COT layer (B4) except for processing temperature and the processing time.

In addition, an antireflection coating forming unit for coating a liquid chemical to the wafer W after coating a liquid resist is provided in a TCT layer (B3).

Furthermore, an exposure device S4 is connected via the interface block S3 to the inner side of the rack unit U6 in the processing block S2. The interface block S3 includes an interface arm B for transferring the wafer W between the rack unit U6 of the processing block S2 and the exposure device S4. The interface block 3 is configured to carry the transfer of the wafer W with respect to the second transfer stages TRS6 to TRS9 of the unit blocks B1 to B4.

Hereinafter, a transfer flow of the wafer W of the resist pattern forming apparatus will be described by using an exemplary case where an antireflection coating is formed on a top and a bottom of a resist film. First, the carrier 90 is loaded from the outside into a carrier block S1 and the wafer W is then taken out from the carrier 90 by using the transfer arm C via the opening/closing member 92. The wafer W is transferred from the transfer arm C to the first transfer stage TRS2 of the rack unit U5 of the second unit block B2. Then, the wafer W is transferred to the main arm A5 of the BCT layer (B3) via the first transfer stage TRS5 by a first conveyance arm D1 to be transferred therefrom to the BCT layer B5. Further, in the BCT layer B5, the wafer W is transferred in the flowing path by main arm A5: the cooling unit→a first antireflection coating forming unit→the heating unit (CHP)→the transfer stage TRS 10 of the rack unit U6, thereby forming a first antireflection coating.

Subsequently, the wafer on the transfer stage TRS 10 is transferred to the transfer stage TRS9 by the second conveyance arm D2 and then to the main arm A4 of the COT layer (B4) to be transferred therefrom to the COT layer (B4). Further, in the COT layer B4, the wafer W is transferred in the flowing path by the main arm A4: the cooling unit (COL)→the coating unit 94→the heating unit (CHP) 95→the first transfer stage TRS 4, thereby forming a resist film on the first antireflection coating.

Thereafter, the wafer on the transfer stage TRS4 is transferred to the transfer stage TRS3 by using the first conveyance arm D1 and then to the main arm A3 of the TCT layer B3 to be transferred therefrom to the TCT layer B3. Further, in the TCT layer (B3), the wafer W is transferred in the flowing path by the main arm A3: the cooling unit (COL)→a second antireflection coating forming unit→the heating unit (CHP)→the peripheral edge exposure device (WEE)→the transfer stage TRS8 of the rack unit U6, thereby forming a second antireflection coating on the resist film.

Next, the wafer W on the stage TRS8 is transferred to the exposure device S4 by the interface arm B and is then subjected to a specific exposure process. The exposure-processed wafer W is transferred to the transfer stages TRS6 or TRS7 of the rack unit U6 by the interface arm B to be transferred therefrom to the DEV layer (B1 or B2). Then, the wafer W on the transfer stage TRS6 or TRS7 is received by the main arm A1 or A2 of the DEV layer (B1 or B2). Next, in the DEV layer (B1 or B2), the wafer is transferred in the flowing path: a heating unit (PEB)→a cooling unit (COL)→a developing unit→a heating unit (POST) and is then subjected to a specific developing process. The developing-processed wafer is transferred to the transfer stage TRS1 or TRS2 to be transferred therefrom to the transfer arm C and is then returned to the original carrier 90 mounted on the carrier block S1 by the transfer arm C.

As describe above, a coating/developing can be scaled down by applying the heat treating apparatus 2 of the present invention to the coating/developing as a heat unit.

Furthermore, the heat treating apparatus 2 can be applied to an insulating layer forming apparatus which forms the insulating layer by coating a precursor of the insulating layer in liquid state on the substrate and heating the precursor.

While the invention has been shown and described with respect to the preferred embodiments, it will be understood by those skilled in the art that various changes and modification may be made without departing from the scope of the invention as defined in the following claims.

What is claimed is:

1. A heat treating apparatus comprising:
a heating plate for heating a substrate coated with a coating liquid;
a cooling plate for cooling the substrate, the cooling plate being moved by a drive mechanism between a home position for transferring the substrate between the cooling plate and an external conveyer mechanism and an upper position above the heating plate for transferring the substrate between the cooling plate and the heating plate;
a heat pipe provided in the cooling plate;
a cooling chamber being moved together with the cooling plate by the drive mechanism and accommodating a cooling liquid for cooling one end side of the heat pipe;
a circulation passage provided in the heat treating apparatus to circulate the cooling liquid in the cooling chamber;
a circulation pump for circulating the cooling liquid in the circulation passage; and
a heat radiating member provided on the circulation passage to radiate the heat received by the cooling chamber to the outside of the heat treating apparatus.

2. The heat treating apparatus of claim 1, wherein the heat treating apparatus further comprises a heat conducting heat pipe, one end of which is submerged in the cooling chamber and the other end of which is disposed in the vicinity of one end of the heat pipe to receive the heat thereof.

3. The heat treating apparatus of claim 1 further comprising an exhaustion fan unit serving as a part of the heat treating radiation member, wherein the heat radiating member includes a heat radiating fin unit, and the exhaustion fan exhausts an upper side atmosphere of the heating plate to the outside of the heat treating apparatus and blows an discharge flow from the exhaustion fan to the heat radiating fin unit.

4. The heat treating apparatus of claim 1, wherein the drive mechanism also drives the circulation pump and the cooling liquid is circulated when moving the cooling plate.

5. A heat treating method for heat-treating a substrate by a heat treating apparatus provided with a heating plate for heating the substrate coated with a coating liquid and a cooling plate for cooling the substrate, the method comprising the steps of:
heating the substrate with the heating plate;

moving the cooling plate between the heating plate and the substrate and mounting the heated substrate onto the cooling plate;

retreating the cooling plate to a region adjacent to the heating plate by a drive mechanism;

transferring the substrate disposed on the cooling plate to an external conveyer mechanism;

radiating the heat of the cooling plate via a heat pipe provided in the cooling plate to a cooling chamber which moves together with the cooling plate and accommodates a cooling liquid therein;

circulating the cooling liquid in the cooling chamber by a circulation pump in a circulation passage provided in the heat treating apparatus; and radiating the heat conducted to the cooling liquid in the cooling chamber to the outside of the heat treating apparatus by a heat radiating member provided on the circulation passage.

6. The method of claim 5, wherein the step of radiating the heat of the cooling plate to the cooling chamber via the heat pipe includes the step of heat-conducting through a heat conducting heat pipe, one end of which is submerged in the cooling chamber and the other end of which is disposed in the vicinity of one end of a heat pipe to receive the heat of the heat pipe.

7. The method of claim 5, further comprising the steps of:

exhausting an upper side atmosphere of the heating plate to the outside of the heat treating apparatus by an exhaustion fan; and blowing a discharge flow from the exhaustion fan to a heat radiating fin unit provided in the heat radiating member.

8. The method of claim 5, wherein the step of circulating the cooling liquid by the circulation pump is performed by driving the circulation pump with the drive mechanism when moving the cooling plate.

9. A storage medium storing a computer executable program for use in a heat treating apparatus for heating and cooling a substrate coated with a coating liquid, wherein the computer executable program is configured to perform the method of claim 5.

* * * * *